(12) United States Patent
Liao et al.

(10) Patent No.: US 9,641,159 B1
(45) Date of Patent: May 2, 2017

(54) FLIP-FLOP CIRCUIT

(71) Applicant: Faraday Technology Corp., Hsinchu (TW)

(72) Inventors: Chiang-Hsiang Liao, Hsinchu (TW); Sheng-Hua Chen, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 15/046,451

(22) Filed: Feb. 18, 2016

(30) Foreign Application Priority Data

Oct. 29, 2015 (TW) .............................. 104135538 A

(51) Int. Cl.
*H03K 3/289* (2006.01)
*H03K 3/037* (2006.01)

(52) U.S. Cl.
CPC ......... *H03K 3/0375* (2013.01); *H03K 3/0372* (2013.01)

(58) Field of Classification Search
None
See application file for complete search history.

(56) References Cited

U.S. PATENT DOCUMENTS

| | | | |
|---|---|---|---|
| 8,274,319 B2 * | 9/2012 | Maeno ............ | H03K 3/356156 327/203 |
| 2008/0084235 A1 * | 4/2008 | Russell ............ | H03K 3/356156 327/218 |

* cited by examiner

*Primary Examiner* — Long Nguyen
(74) *Attorney, Agent, or Firm* — Winston Hsu; Scott Margo

(57) ABSTRACT

A flip-flop circuit including a first logic circuit, a first master latch, a second master latch, and a slave latch is provided. The first logic circuit operates a logic operation on a selecting signal and a clock signal to generate a first control signal. The first master latch receives a data signal according to the first control signal and latches the data signal according to the selecting signal and the clock signal. The second master latch receives a scan data signal according to the selecting signal and the clock signal, wherein an output terminal of the second master latch is directly connected to an output terminal of the first master latch. The slave latch latches a signal on the output terminals of the first and second master latches for generating an output signal.

10 Claims, 4 Drawing Sheets

US 9,641,159 B1

FLIP-FLOP CIRCUIT

CROSS-REFERENCE TO RELATED APPLICATION

This application claims the priority benefit of Taiwan application serial no. 104135538, filed on Oct. 29, 2015. The entirety of the above-mentioned patent application is hereby incorporated by reference herein and made a part of this specification.

BACKGROUND OF THE INVENTION

Field of the Invention

The invention relates to a flip-flop circuit, and particularly relates to a flip-flop circuit capable of decreasing a setup time.

Description of Related Art

In a design of a digital integrated circuit (IC), a flip-flop circuit is a commonly used register. In a chip level design, a scanning type flip-flop is usually applied in the design of a clock tree. In an application requiring a high-speed computation (for example, a high-speed central processing unit), in order to make the flip-flop circuit to satisfy the demand of the high-speed computation, to effectively decrease a setup time of the flip-flop circuit becomes an important demand.

In the conventional technical field, the flip-flop circuit may receive a data signal, and implement a data latch operation through a plurality of transmission gates. Generally, the flip-flop includes two latches connected in series, and the transmission gates in the latches may implement the data latch operation through complementary turning on or off operations. On the other hand, in order to decrease the setup time of the flip-flop circuit, in the conventional technique, a phase difference between a clock signal and an inverted clock signal in the flip-flop circuit can be adjusted for implementation. However, such method prolongs a CK to Q delay of a clock terminal to an output terminal of the flip-flop circuit.

SUMMARY OF THE INVENTION

The invention is directed to a flip-flop circuit, which may effectively decrease a required setup time.

The invention provides a flip-flop circuit including a first logic circuit, a first master latch, a second master latch, and a slave latch. The first logic circuit receives a selecting signal and a clock signal, and operates a logic operation on the selecting signal and the clock signal to generate a first control signal. The first master latch is coupled to the first logic circuit and receives the first control signal. The first master latch receives the clock signal and a data signal, and receives the data signal according to the first control signal, and latches the data signal according to the clock signal and the selecting signal. The second master latch receives the selecting signal, the clock signal and a scan data signal, and latches the scan data signal according to the selecting signal and the clock signal, where an output terminal of the second master latch is directly connected to an output terminal of the first master latch. The slave latch is coupled to the output terminals of the first master latch and the second master latch, and latches a signal on the output terminals of the first and second master latches according to the clock signal for generating an output signal.

According to the above descriptions, by setting the first logic circuit at a front end of the first master latch, and using the first control signal generated by the first logic circuit for controlling a time point that the first master latch receives the data signal, the time point that the first master latch receives the data signal can be directly controlled through a variation of a voltage level of the clock signal, which may effectively decrease the demand of the setup time of the flip-flop circuit. More importantly, the first master latch of the invention is maintained to latch the data signal according to the clock signal and the selecting signal, and the CK to Q delay of the clock terminal to the output terminal thereof is not prolonged.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
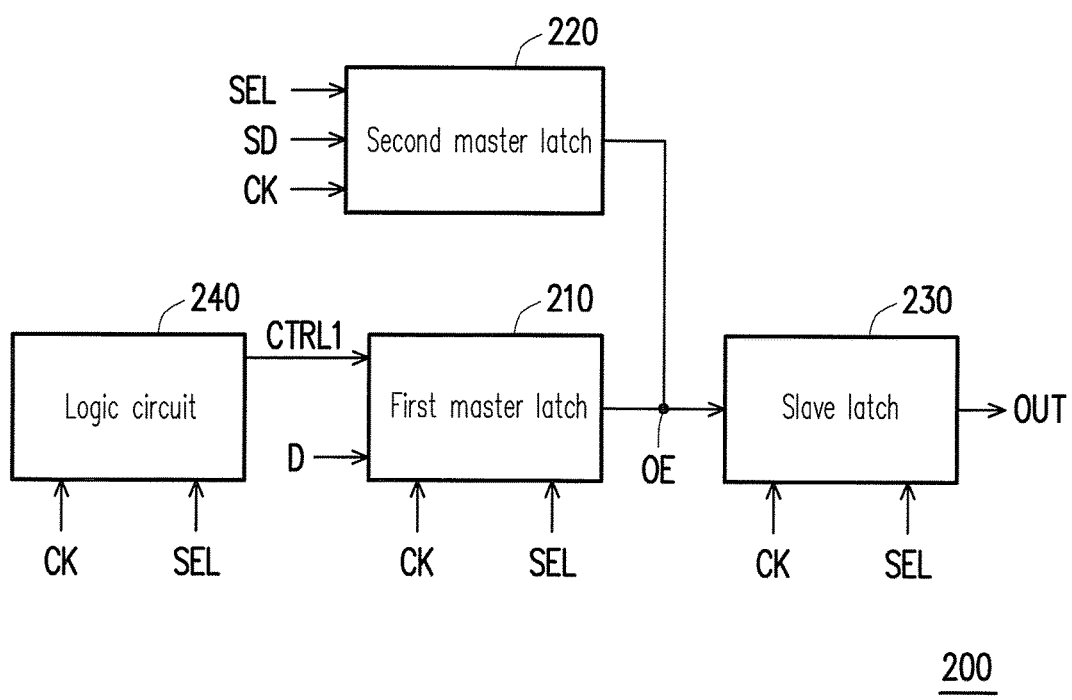
FIG. 1 is a schematic diagram of a flip-flop circuit according to an embodiment of the invention.

Referring to FIG. 1, FIG. 1 is a schematic diagram of a flip-flop circuit according to an embodiment of the invention. The flip-flop circuit 200 includes a first master latch 210, a second master latch 220, a slave latch 230 and a logic circuit 240. The logic circuit 240 receives a selecting signal SEL and a clock signal CK, and operates a logic operation on the selecting signal SEL and the clock signal CK to generate a control signal CTRL1. The first master latch 210 is coupled to the logic circuit 240. The first master latch 210 receives the control signal CTRL1 generated by the logic circuit 240, and receives a data signal D, the clock signal CK and the selecting signal SEL. The first master latch 210 receives the data signal D according to the control signal CTRL1, and latches the data signal D according to the clock signal CK and the selecting signal SEL.

The second master latch 220 receives the selecting signal SEL, the clock signal CK and a scan data signal SD. The second master latch 220 latches the scan data signal SD according to the selecting signal SEL and the clock signal CK. It should be noted that an output terminal of the second master latch 220 is directly connected to an output terminal OE of the first master latch 210.

The slave latch 230 is coupled to the output terminals of the first master latch 210 and the second master latch 220. The slave latch 230 receives and latches a signal on the output terminals of the first and second master latches 210 and 220 according to the clock signal CK and the selecting signal SEL for generating an output signal OUT.

In view of the operation detail, the selecting signal SEL is used for indicating to turn on one of the first master latch 210 and the second master latch 220 to perform the data latch operation of the data signal D or the scan data signal SD. For example, when the selecting signal SEL is in a first logic level (for example, a logic low level), the first master latch 210 is turned on to perform the data latch operation on the data signal D, and the second master latch 220 is turned off without performing the data latch operation. Comparatively, when the selecting signal SEL is in a second logic level (for example, a logic high level), the second master latch 220 is turned on to perform the data latch operation on the scan data signal SD, and the first master latch 210 is turned off without performing the data latch operation.

It should be noted that the logic circuit 240 operates the logic operation on the selecting signal SEL and the clock signal CK to generate the control signal CTRL1. The control signal CTRL is provided to the first master latch 210 to serve as a basis for receiving the data signal D. Compared to the clock signal CK, the selecting signal SEL has a relatively stable logic level, and according to the above description, when the selecting signal SEL is in the first logic level, and a logic level of the clock signal CK is gradually transited from the second logic level to the first logic level, at the moment that the logic level of the clock signal CK is transited to the first logic level, the first master latch 210 may opportunely receive the data signal D according to the correspondingly generated control signal CTRL, and performs the latch operation on the data signal D according to the clock signal CK and the selecting signal SEL. In this way, a setup time of the flip-flop circuit 200 is effectively reduced.

On the other hand, in the present embodiment, the clock signal CK and the selecting signal SEL used for implementing the latch operation of the data signal D are not changed, and therefore a CK to Q delay of a clock terminal to an output terminal of the flip-flop circuit 200 is not prolonged.

Figure 2:
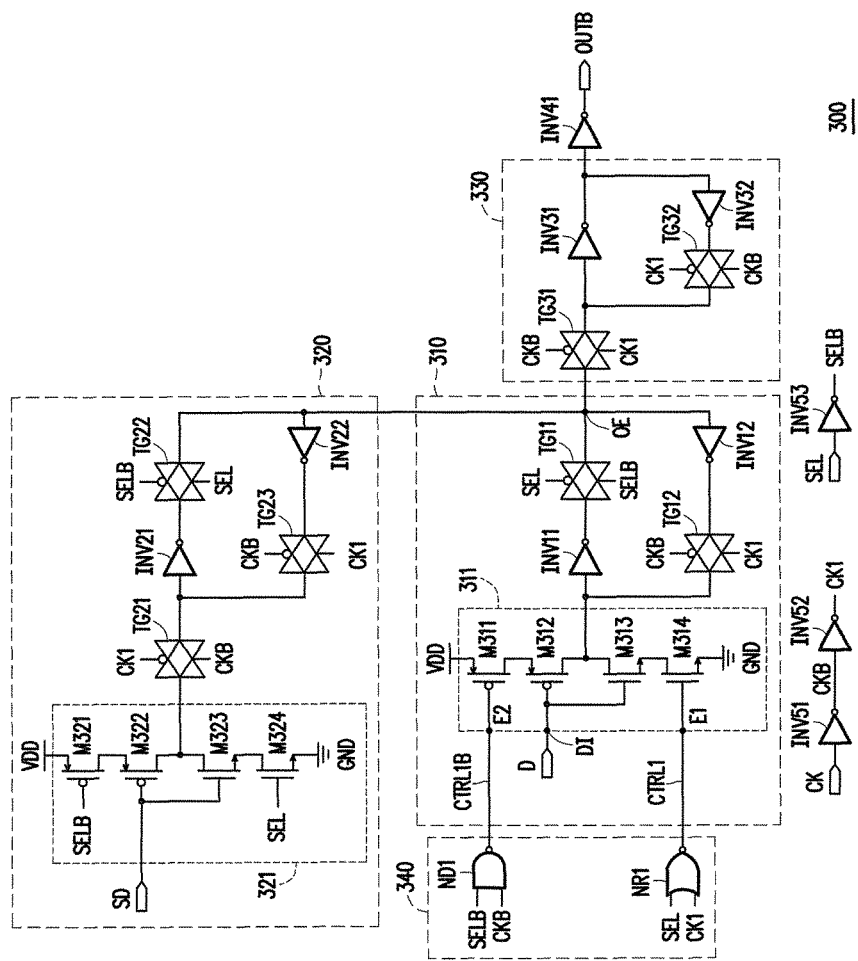
FIG. 2 is a circuit diagram of a flip-flop circuit according to an embodiment of the invention.

Referring to FIG. 2, FIG. 2 is a circuit diagram of a flip-flop circuit according to an embodiment of the invention. The flip-flop circuit 300 includes a first master latch 310, a second master latch 320, a slave latch 330 and a logic circuit 340. In the present embodiment, the logic circuit 340 includes logic gates NR1 and ND1. The logic gate NR1 is a NOR gate, and the logic gate ND1 is a NAND gate. The logic gate NR1 receives the selecting signal SEL and a clock signal CK1, and the logic gate ND1 receives an inverted signal SELB of the selecting signal SEL and an inverted signal CKB of the clock signal CK1. The logic circuit 340 generates a control signal CTRL1 with the logic high level and an inverted signal CTRL1B of the control signal CTRL1 with the logic low level when the selecting signal SEL is in the logic low level and the clock signal CK1 is transited to the logic low level. Comparatively, in case that the selecting signal SEL and the clock signal CK1 are not simultaneously in the logic low level, the logic circuit 340 generates the control signal CTRL1 with the logic low level and the inverted signal CTRL1B thereof with the logic high level.

The first master latch 310 includes a tri-state inverter 311, inverters INV11 and INV12 and transmission gates TG11 and TG12. The tri-state inverter 311 has a data input terminal DI and enable terminals E1 and E2. The data input terminal DI receives the data signal D, and the enable terminals E1 and E2 respectively receive the control signal CTRL1 and CTRL1B. The tri-state inverter 311 is composed of transistors M311-M314 connected in series, where a first terminal of the transistor M311 receives a power voltage VDD, a second terminal thereof is coupled to a first terminal of the transistor M312, and a control terminal of the transistor M311 is the enable terminal E2. A second terminal of the transistor M312 is coupled to a first terminal of the transistor M313, a second terminal of the transistor M313 is coupled to a first tell final of the transistor M314, and control terminals of the transistors M312 and M313 are coupled to the data input terminal DI. Moreover, a second terminal of the transistor M314 is coupled to a reference ground terminal GND, and a control terminal thereof is the enable terminal E1.

In the tri-state inverter 311, the second terminal of the transistor M312 is an output terminal of the tri-state inverter 311. The output terminal of the tri-state inverter 311 is further coupled to an input terminal of the inverter INV11, and an output terminal of the inverter INV11 is coupled to an input terminal of the transmission gate TG11. Moreover, an output terminal of the transmission gate TG11 is the output terminal OE of the first master latch 310, and is coupled to an input terminal of the inverter INV12. An output terminal of the inverter INV12 is coupled to an input terminal of the transmission gate TG12, and an output terminal of the transmission gate TG12 is coupled to the input terminal of the inverter INV11. The transmission gate TG11 is turned on/off according to the selecting signal SEL and the inverted signal SELB thereof, and the transmission gate TG12 is turned on/off according to the clock signal CK1 and the inverted signal CKB thereof.

In view of the operation detail, when the selecting signal SEL is maintained to the logic low level, and at the moment that the clock signal CK1 is transited to the logic low level, the logic circuit 340 generates the control signal CTRL1 and the inverted signal CTRL1B thereof with the logic high level. Meanwhile, the tri-state inverter 311 may receive the data signal D on the data input terminal DI, and transmits the data signal D to the internal of the first master latch 310, i.e. the input terminal of the inverter INV11. Meanwhile, through the turned on transmission gate TG11 and the inverter INV12, the latch operation on the data signal D can be smoothly implemented when the clock signal CK1 is transited to the logic high level.

It should be noticed that compared to the conventional technique, the output terminal of the tri-state inverter 311 of the present embodiment is directly connected to the inverter INV11, and none transmission gate is disposed therebetween, such that the number of circuit components between the data input terminal DI and the output terminal OE of the first master latch 310 is decreased to effectively mitigate a transmission delay of the data signal D occurred therebetween. Moreover, by using the logic circuit 340 to integrate the selecting signal SEL and the clock signal CK1 to generate the control signal CTRL1, and controlling a time point that the tri-state inverter 311 receives the data signal D through the control signal CTRL1, the demand of the setup time is effectively decreased.

It should be noted that in the present embodiment, through inverters INV51 and INV52 connected in series, the inverted signal CKB and the clock signal CK1 can be sequentially produced according to the clock signal CK. Through an inverter INV53, the inverted signal SELB can be produced according to the selecting signal SEL.

In view of the second master latch 320, the second master latch 320 includes a tri-state inverter 321, inverters INV21 and INV22 and transmission gates TG21, TG22 and TG23. The tri-state inverter 321 is composed of transistors M321-M324 connected in series, where a first terminal of the transistor M321 receives the power voltage VDD, a second terminal thereof is coupled to a first terminal of the transistor M322, and a control terminal of the transistor M321 receives the inverted signal SELB of the selecting signal SEL. A second terminal of the transistor M322 is coupled to a first terminal of the transistor M323, a second terminal of the transistor M323 is coupled to a first terminal of the transistor M324, and control terminals of the transistors M322 and M323 are coupled to each other to receive the scan data signal SD. Moreover, a second terminal of the transistor M324 is coupled to the reference ground terminal GND, and a control terminal thereof receives the selecting signal SEL.

The second terminal of the transistor M322 forms an output terminal of the tri-state inverter 321, and the output terminal of the tri-state inverter 321 is further coupled to an input terminal of the transmission gate TG21. Moreover, an output terminal of the transmission gate TG21 is coupled to an input terminal of the inverter INV21, and an output terminal of the inverter INV21 is coupled to an input terminal of the transmission gate TG22. An output terminal of the transmission gate TG22 is coupled to an input terminal of the inverter INV22, and forms an output terminal of the second master latch 320. The output terminal of the second master latch 320 is directly connected to the output terminal OE of the first master latch 310. Moreover, an output terminal of the inverter INV22 is coupled to an input terminal of the transmission gate TG23, and an output terminal of the transmission gate TG23 is coupled to the output terminal of the transmission gate TG21. In the present embodiment, the transmission gates TG21 and TG23 are turned on/off according to the clock signal CK1, and turning on/off states of the transmission gates TG21 and TG23 are opposite to each other. The transmission gate TG22 is turned on/off according to the selecting signal SEL.

In view of the slave latch 330, the slave latch 330 includes transmission gates TG31 and TG32 and inverters INV31 and INV32. An input terminal of the transmission gate TG31 is coupled to the output terminal OE of the first master latch 310, and an output terminal of the transmission gate TG31 is coupled to an input terminal of the inverter INV31. An output terminal of the inverter INV31 is coupled to an input terminal of the inverter INV32, and an output terminal of the inverter INV32 is coupled to an input terminal of the transmission gate TG32, and an output terminal of the transmission gate TG32 is coupled to the output terminal of the transmission gate TG31. The transmission gates TG31 and TG32 are turned on/off according to the clock signal CK1, and turning on/off states of the transmission gates TG31 and TG32 are opposite to each other. The output terminal of the inverter INV31 can be an output terminal of the slave latch 330 and is used for producing the output signal OUT.

In the present embodiment, the flip-flop circuit 300 may further include an inverter INV31. An input terminal of the inverter INV41 receives the output signal OUT and produces an inverted output signal OUTB. The logic levels of the inverted output signal OUTB and the latched data signal D or the scan data signal SD are the same.

Figure 3A:
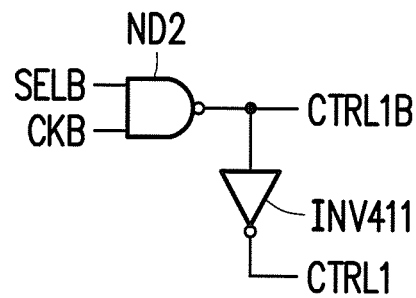
FIG. 3A and FIG. 3B are different implementations of a logic circuit according to the embodiments of the invention.
Figure 3B:
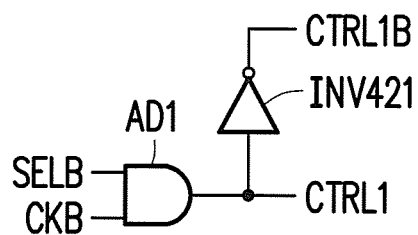

Referring to FIG. 3A and FIG. 3B, FIG. 3A and FIG. 3B are different implementations of the logic circuit according to the embodiments of the invention. In FIG. 3A, the logic circuit 410 includes a logic gate ND2 and an inverter INV411. The logic gate ND2 is a NAND gate, and receives the inverted signals SELB and CKB. The logic gate ND2 generates the inverted signal CTRL1B of the control signal CTRL1 according to the inverted signals SELB and CKB. An input terminal of the inverter INV411 is coupled to an output terminal of the logic gate ND2, and generates the control signal CTRL1 according to the inverted signal CTRL1B.

The logic circuit 420 of FIG. 3B is a variation of the logic circuit 410 of FIG. 3A, in which the logic gate AD1 is an AND gate, and the logic gate AD1 receives the inverted signals SELB and CKB, and generates the control signal CTRL1 according to the inverted signals SELB and CKB. An input terminal of the inverter INV421 is coupled to an output terminal of the logic gate AD1, and the inverter INV421 generates the inverted signal CTRL1B according to the control signal CTRL1.

According to the implementations of FIG. 3A and FIG. 3B, it can be easily known that the logic circuit of the invention may have a plurality of implementations. Those people with basic capability in logic design art should understand that the same logic operation result can be implemented through a plurality of different logic gate combinations. For example, the AND gate can be replaced by the NOR gate and a plurality of inverters, the OR gate can be replaced by the NAND gate and a plurality of inverters. Therefore, the implementations of FIG. 3A and FIG. 3B are not necessary implementation of the invention, and are not used for limiting an implementation scope of the invention.

Figure 4:
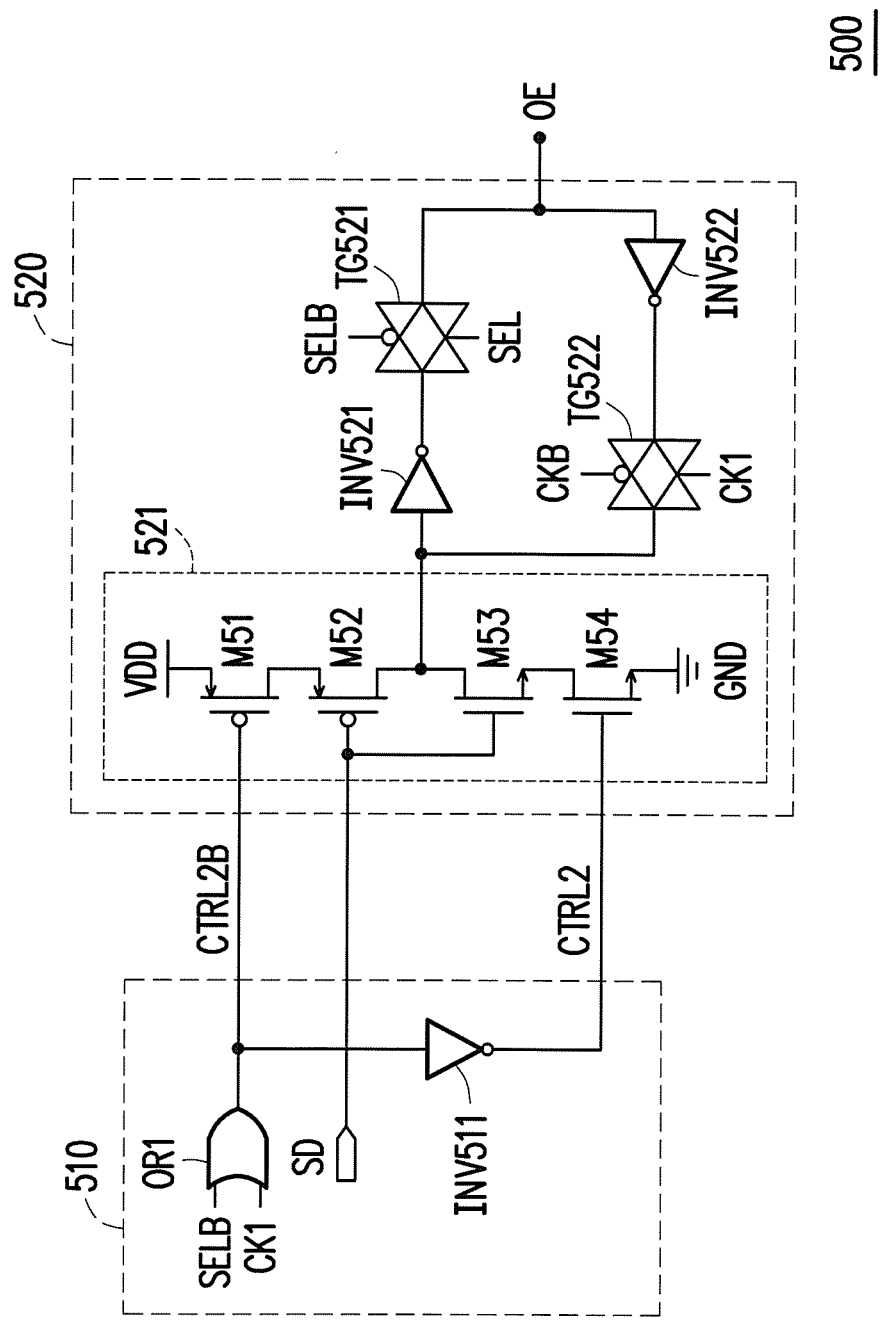
FIG. 4 is a schematic diagram of another implementation of a second master latch according to an embodiment of the invention.

Referring to FIG. 4, FIG. 4 is a schematic diagram of another implementation of the second master latch according to an embodiment of the invention. In FIG. 4, a logic circuit 510 is configured at a front end of the second master latch 520. Compared to the embodiment of FIG. 2, one transmission gate is omitted in the second master latch 520. In view of an implementation detail, the logic circuit 510 includes a logic gate OR1 and an inverter INV51. The logic gate OR1 is an OR gate, and receives the inverted signal SELB and the clock signal CK1. The logic gate OR1 generates an inverted signal CTRL2B of a control signal CTRL2 according to the inverted signal SELB and the clock signal CK1. An input terminal of the inverter INV511 is coupled to an output terminal of the logic gate OR1, and the inverter INV511 generates the control signal CTRL2 according to the inverted signal CTRL2B.

Moreover, the second master latch 520 includes a tri-state inverter 521, inverters INV521, INV522 and transmission gates TG521 and TG522. The tri-state inverter 521 is composed of four transistors M51-M54 connected in series, where control terminals of the transistors M52 and M53 receive the scan data signal SD, and control terminals of the transistors M51 and M54 respectively receive the inverted signal CTRL2B and the control signal CTRL2. An output terminal of the tri-state inverter 521 is coupled to an input terminal of the inverter INV521, and an output terminal of the inverter INV521 is coupled to an input terminal of the transmission gate TG521. An output terminal of the transmission gate TG521 is coupled to an input terminal of the inverter INV522 and is directly connected to the output terminal OE of the first master latch. An output terminal of the inverter INV522 is coupled to an input terminal of the transmission gate TG522, and an output terminal of the transmission gate TG522 is coupled to the input terminal of the inverter INV521.

In the present embodiment, by integrating the selecting signal SEL and the clock signal CK1 through the logic circuit 510, when the flip-flop circuit performs the data latch operation on the scan data signal SD, the required setup time can also be effectively decreased, so as to improve the working efficiency of the flip-flop circuit.

In summary, by setting the logic circuit at the front end of the first master latch, and using the logic circuit to integrate the selecting signal and the clock signal to generate the control signal, the control signal is used for controlling the time point that the first master latch receives the data signal, so as to effectively decrease the setup time required by the flip-flop circuit. Moreover, according to the above mechanism, the CK to Q delay of the clock terminal to the output terminal of the flip-flop circuit is not prolonged, so as to effectively improve the working efficiency of the flip-flop circuit.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A flip-flop circuit, comprising:
   a first logic circuit, receiving a selecting signal and a clock signal, and operating a logic operation on the selecting signal and the clock signal to generate a first control signal;
   a first master latch, coupled to the first logic circuit and receiving the first control signal, and receiving the clock signal and a data signal, wherein the first master latch receives the data signal according to the first control signal, and latches the data signal according to the clock signal and the selecting signal;
   a second master latch, receiving the selecting signal, the clock signal and a scan data signal, and latching the scan data signal according to the selecting signal and the clock signal, wherein an output terminal of the second master latch is directly connected to an output terminal of the first master latch; and
   a slave latch, coupled to the output terminals of the first master latch and the second master latch, and latching a signal on the output terminals of the first and second master latches according to the clock signal and the selecting signal for generating an output signal.

2. The flip-flop circuit as claimed in claim 1, wherein the first master latch comprises:
   a tri-state inverter, having a data input terminal and an enable terminal, wherein the data input terminal of the tri-state inverter receives the data signal, and the enable terminal of the tri-state inverter receives the first control signal;
   a first inverter, having an input terminal coupled to an output terminal of the tri-state inverter;
   a first transmission gate, having an input terminal coupled to an output terminal of the first inverter, wherein the first transmission gate is turned on or turned off according to the selecting signal;
   a second inverter, having an input terminal coupled to an output terminal of the first transmission gate; and
   a second transmission gate, having an input terminal coupled to an output terminal of the second inverter, and an output terminal coupled to the input terminal of the first inverter, wherein the second transmission gate is turned on or turned off according to the clock signal,
   wherein the output terminal of the first transmission gate is an output terminal of the first master latch.

3. The flip-flop circuit as claimed in claim 1, wherein the second master latch comprises:
   a tri-state inverter, having a data input terminal and an enable terminal, wherein the data input terminal of the tri-state inverter receives the scan data signal, and the enable terminal of the tri-state inverter receives the selecting signal;
   a first inverter, having an input terminal coupled to an output terminal of the tri-state inverter;
   a first transmission gate, having an input terminal coupled to an output terminal of the first inverter, wherein the first transmission gate is turned on or turned off according to the selecting signal;
   a second inverter, having an input terminal coupled to an output terminal of the first transmission gate; and
   a second transmission gate, having an input terminal coupled to an output terminal of the second inverter, and an output terminal coupled to the input terminal of the first inverter, wherein the second transmission gate is turned on or turned off according to the clock signal,
   wherein the output terminal of the first transmission gate is an output terminal of the second master latch.

4. The flip-flop circuit as claimed in claim 3, wherein the second master latch further comprises:
   a third transmission gate, coupled between the output terminal of the tri-state inverter and the input terminal of the first inverter, wherein the third transmission gate is turned on or turned off according to the clock signal, and turning on/off states of the third transmission gate and the second transmission gate are opposite to each other.

5. The flip-flop circuit as claimed in claim 1, wherein the first logic circuit comprises:
   a first logic gate, generating the first control signal according to the selecting signal and the clock signal; and
   a second logic gate, generating an inverted signal of the first control signal according to an inverted signal of the selecting signal and an inverted signal of the clock signal.

6. The flip-flop circuit as claimed in claim 1, wherein the first logic circuit comprises:
   a logic gate, generating the first control signal according to the selecting signal and the clock signal; and
   an inverter, receiving the first control signal and generating an inverted signal of the first control signal.

7. The flip-flop circuit as claimed in claim 1, further comprising:
   a second logic circuit, coupled to the second master latch, and operating a logic operation on the selecting signal and the clock signal to generate a second control signal, wherein the second master latch further receives the scan data signal according to the second control signal.

8. The flip-flop circuit as claimed in claim 7, wherein the second logic circuit comprises:
   a logic gate, generating an inverted signal of the second control signal according to the selecting signal and the clock signal; and
   an inverter, coupled to the logic gate, receiving the inverted signal of the second control signal, and generating the second control signal.

9. The flip-flop circuit as claimed in claim 1, wherein the slave latch comprises:
   a first transmission gate, having an input terminal coupled to the output terminals of the first and second master latches, wherein the first transmission gate is turned on or turned off according to the clock signal;
   a first inverter, having an input terminal coupled to an output terminal of the first transmission gate, and an output terminal of the first inverter generating the output signal;
   a second inverter, having an input terminal coupled to the output terminal of the first inverter; and
   a second transmission gate, having an input terminal coupled to an output terminal of the second inverter, and an output terminal of the second transmission gate coupled to the output terminal of the first transmission gate, wherein the second transmission gate is turned on or turned off according to the clock signal.

10. The flip-flop circuit as claimed in claim 1, further comprising:
an inverter, having an input terminal coupled to an output terminal of the slave latch for receiving the output signal, and generating an inverted signal of the output signal.

* * * * *